United States Patent
Seetharaman et al.

(10) Patent No.: US 10,734,079 B1
(45) Date of Patent: Aug. 4, 2020

(54) SUB BLOCK MODE READ SCRUB DESIGN FOR NON-VOLATILE MEMORY

(71) Applicant: Western Digital Technologies, Inc., San Jose, CA (US)

(72) Inventors: Srinivasan Seetharaman, Milpitas, CA (US); Sourabh Sankule, Bangalore (IN); Piyush Girish Sagdeo, Santa Clara, CA (US); Gautam Ashok Dusija, Burlingame, CA (US); Chris Nga Yee Yip, Saratoga, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/415,923

(22) Filed: May 17, 2019

(51) Int. Cl.
| | |
|---|---|
| *G11C 11/34* | (2006.01) |
| *G11C 16/04* | (2006.01) |
| *G11C 16/16* | (2006.01) |
| *G11C 16/28* | (2006.01) |
| *G06F 3/06* | (2006.01) |
| *G11C 16/08* | (2006.01) |
| *G06F 9/50* | (2006.01) |

(52) U.S. Cl.
CPC .............. *G11C 16/16* (2013.01); *G06F 3/064* (2013.01); *G06F 3/0679* (2013.01); *G06F 9/5077* (2013.01); *G11C 16/08* (2013.01); *G11C 16/28* (2013.01); *G06F 3/0604* (2013.01)

(58) Field of Classification Search
CPC ......... G11C 16/16; G11C 16/08; G11C 16/28; G06F 3/064; G06F 3/0679
See application file for complete search history.

(56) References Cited

U.S. PATENT DOCUMENTS

| | | | | |
|---|---|---|---|---|
| 2013/0128666 | A1* | 5/2013 | Avila | G11C 16/3418 365/185.11 |
| 2015/0149693 | A1* | 5/2015 | Ng | G06F 3/0619 711/103 |
| 2016/0124679 | A1* | 5/2016 | Huang | G06F 3/0647 711/103 |
| 2018/0053562 | A1* | 2/2018 | Reusswig | G11C 16/3431 |
| 2018/0350446 | A1* | 12/2018 | K | G11C 29/021 |
| 2019/0362798 | A1* | 11/2019 | Yang | G06F 11/1068 |

* cited by examiner

*Primary Examiner* — Toan K Le
(74) *Attorney, Agent, or Firm* — Loza & Loza, LLP; Gabriel Fitch

(57) ABSTRACT

The disclosure relates in some aspects to a read scrub design for a non-volatile memory that includes a block comprising N wordlines partitioned into a first sub-block comprising a first subset of the N wordlines and a second sub-block comprising a second subset of the N wordlines different than the first subset. In some aspects, the disclosure relates to detecting a trigger event associated with a read command performed on the first sub-block. A target sub-block test is then performed in response to a detection of the trigger event to determine whether to add the first sub-block to a read scrub queue. If the first sub-block is added to the read scrub queue, a sister sub-block test is then performed to determine whether to add the second sub-block to the read scrub queue.

20 Claims, 12 Drawing Sheets

SUB BLOCK MODE READ SCRUB DESIGN FOR NON-VOLATILE MEMORY

FIELD

The disclosure relates, in some embodiments, to non-volatile memory (NVM) devices and memory controllers for use therewith. More specifically, but not exclusively, the disclosure relates to performing a read scrub on a physical block of non-volatile memory logically partitioned into sub-blocks.

INTRODUCTION

Solid state devices (such as a solid state drive), hereinafter referred to as an SSD incorporating non-volatile memories (NVMs), such as NAND flash memories and NOR flash memories (hereinafter flash memory will refer to either of NAND flash memory or NOR flash memory), are replacing or supplementing conventional rotating hard disk drives for mass storage in many consumer or industrial electronics and computers. In a typical SSD-based product, a host computing device includes or communicates with an NVM device controller that in turn controls access to one or more NVM devices.

With respect to flash memories, it should be noted that such memories are susceptible to corruption due to various factors. For instance, data in flash memories may be corrupted by ordinary read, program and erase sequences, where memory cells in physical proximity to those that are subject to a read, program or erase action may be unintentionally stressed. Such stress may alter stored charge levels to a point where bit errors are induced in those memory cells. With respect to read operations, read stress is induced not only on the word line being read but also when the read voltage is applied to other word lines in a physical memory block of the flash memory. The stress on word lines not being read is sometimes referred to as a read disturb effect.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage apparatus that includes a processor coupled to a non-volatile memory in which a block comprises N wordlines partitioned into a first sub-block comprising a first subset of the N wordlines and a second sub-block comprising a second subset of the N wordlines different than the first subset. In one example, the processor may be configured to detect a trigger event associated with a read command performed on the first sub-block. For this example, in response to a detection of the trigger event, the processor may be further configured to perform a target sub-block test to determine whether to add the first sub-block to a read scrub queue. The processor may then be further configured to perform a sister sub-block test, in response to an addition of the first sub-block to the read scrub queue, to determine whether to add the second sub-block to the read scrub queue.

In another embodiment of the disclosure, a data storage method operable on a non-volatile memory device is disclosed in which the non-volatile memory device includes a block comprising N wordlines partitioned into a first sub-block comprising a first subset of the N wordlines and a second sub-block comprising a second subset of the N wordlines different than the first subset. In one example, the method includes detecting a trigger event associated with a read command performed on the first sub-block. The method may further include performing a target sub-block test, in response to a detection of the trigger event, to determine whether to add the first sub-block to a read scrub queue. The method may also include performing a sister sub-block test, in response to an addition of the first sub-block to the read scrub queue, to determine whether to add the second sub-block to the read scrub queue.

In a further embodiment of the disclosure, another data storage apparatus is provided, which includes a non-volatile memory having a block comprising N wordlines partitioned into a first sub-block comprising a first subset of the N wordlines and a second sub-block comprising a second subset of the N wordlines different than the first subset. In one example, the apparatus includes means for detecting a trigger event associated with a read command performed on the first sub-block. The apparatus may further include means for performing a target sub-block test, in response to a detection of the trigger event, to determine whether to add the first sub-block to a read scrub queue. The apparatus may also include means for performing a sister sub-block test, in response to an addition of the first sub-block to the read scrub queue, to determine whether to add the second sub-block to the read scrub queue.

In yet another embodiment of the disclosure, a non-transitory computer-readable medium storing computer-executable code for storing data is disclosed. In a particular example, the non-transitory computer-readable medium is operable on a non-volatile memory that includes a block comprising N wordlines partitioned into a first sub-block comprising a first subset of the N wordlines and a second sub-block comprising a second subset of the N wordlines different than the first subset. The computer-readable medium may also include code to perform a target sub-block test, in response to a detection of the trigger event, to determine whether to add the first sub-block to a read scrub queue. The computer-readable medium may then further include code to perform a sister sub-block test, in response to an addition of the first sub-block to the read scrub queue, to determine whether to add the second sub-block to the read scrub queue.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

To mitigate the potential harm caused by a read disturb, a read scrub algorithm may be implemented to keep a check on the quality of data stored in each physical block of a flash memory. If a data quality issue is detected, the data can be relocated to a new location before it becomes unreadable. As the architecture of physical blocks in flash memory evolves, however, it is anticipated that conventional read scrub methods will become inadequate. Accordingly, an improved read scrub algorithm that is compatible with new physical block architectures is desirable and disclosed herein.

Example Memory System

Figure 1:
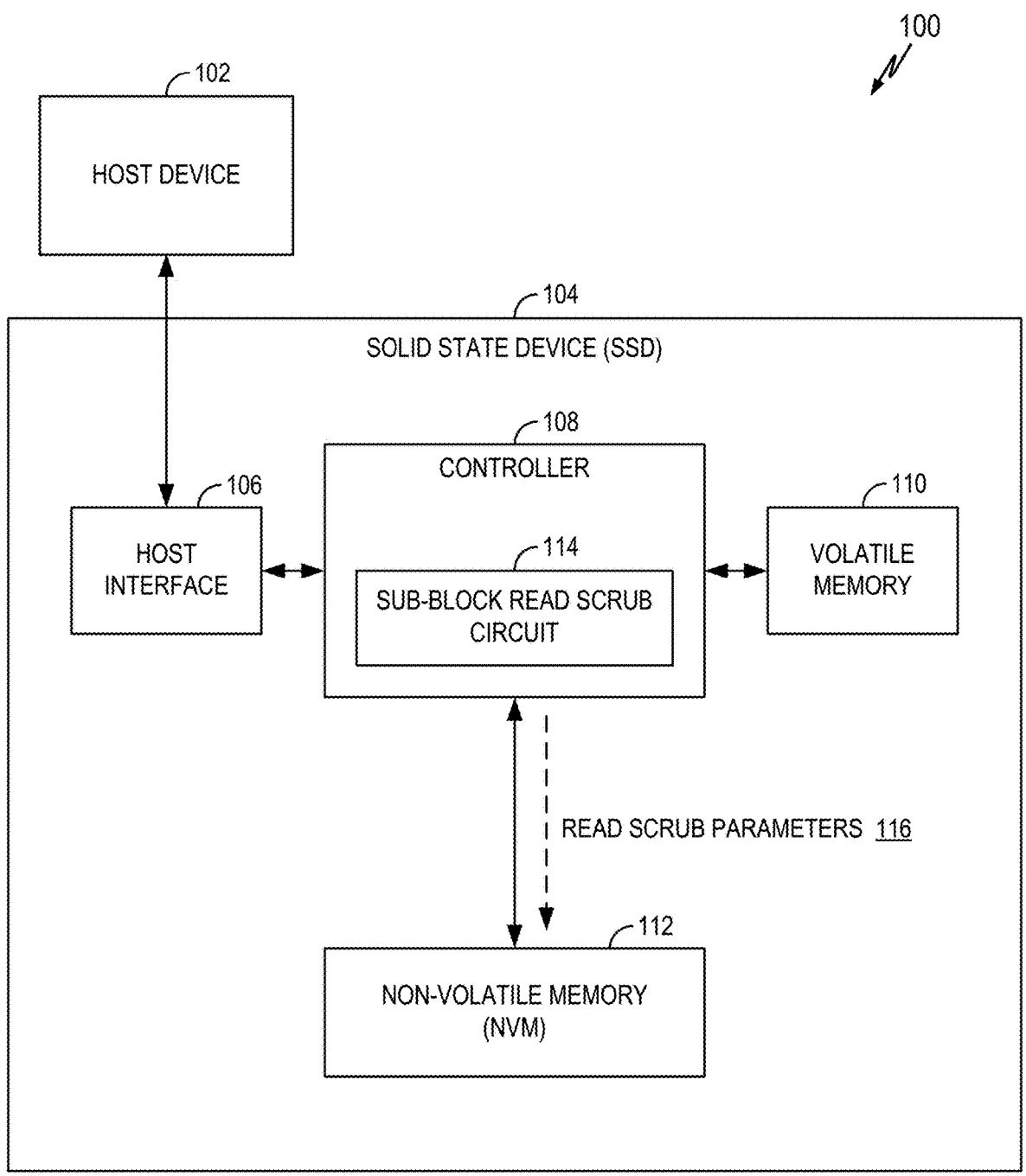
FIG. 1 illustrates an example memory system including a solid state device (SSD) configured in accordance with one or more aspects of the disclosure.

FIG. 1 illustrates an embodiment of a memory system 100 that includes a host device 102 and a solid state device (SSD) 104 communicatively coupled to the host device 102. A data storage device/apparatus may include one or more SSDs. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device having a need for data storage or retrieval and a compatible interface for communicating with the SSD 104. For example, the host device 102 may be a computing device, a personal computer, a portable computer, or workstation, a server, a personal digital assistant, a digital camera, a digital phone, or the like.

The SSD 104 includes a host interface 106, a controller 108, a volatile memory 110, and a non-volatile memory (NVM) 112. The host interface 106 is coupled to the controller 108 and facilitates communication between the host device 102 and the controller 108. Additionally, the controller 108 is coupled to the volatile memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 102 includes the SSD 104 (e.g., the host device 102 and the SSD 104 are implemented as a single component). In other embodiments, the SSD 104 is remote with respect to the host device 102 or is contained in a remote computing system coupled in communication with the host device 102. For example, the host device 102 may communicate with the SSD 104 through a wireless communication link.

The controller 108 controls operation of the SSD 104. In various embodiments, the controller 108 receives commands from the host device 102 through the host interface 106 and performs the commands to transfer data between the host device 102 and the NVM 112. In addition, the controller 108 performs internal operations such as garbage collection operations, data integrity operations, and wear leveling operations. The controller 108 may include any type of processing device, such as a microprocessor, a microcontroller, an embedded controller, a logic circuit, software, firmware, or the like, for controlling operation of the SSD 104.

In some embodiments, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The volatile memory 110 may be any memory, computing device, or system capable of storing data. For example, the volatile memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the volatile memory 110, or a portion thereof, to store data during the transfer of data between the host device 102 and the NVM 112. For example, the volatile memory 110 or a portion of the volatile memory 110 may be a cache memory.

The controller 108 includes a sub-block read scrub circuit 114 for performing a read scrub on a physical block of NVM 112 logically partitioned into sub-blocks based on read scrub parameters 116 sent to the NVM 112. In some embodiments, the controller 108 determines the read scrub parameters 116. For example, the controller 108 may define read scrub parameters 116 so as to trigger a particular type of read scrub based on particular preferences (e.g., whether detection of a particular type of disturb pattern is desired). For instance, aspects disclosed herein include a read scrub that utilizes a dynamic read table (DRT) to analyze a particular wordline upon detecting that a default read operation on a target sub-block has failed. In another aspect disclosed herein, a read scrub is contemplated in which a particular wordline, plus its neighboring wordlines, are periodically scanned upon detecting that a threshold number of reads have been performed on the NVM 112. In some embodiments, the controller 108 receives the read scrub parameters 116 (e.g., different parameters corresponding to the different types of read scrubs) from another entity. In this case, the controller 108 may select a set of read scrub parameters 116 to be used by the NVM 112 in view of one or more preferences (e.g., whether detection of a particular type of disturb pattern is desired).

Example Sub-Block Architecture

It should be appreciated that non-volatile memory (NVM, such as flash memory) is typically segmented into blocks and pages. In recent designs, blocks have been getting larger as a way to increase bit storage per block. For some designs, these larger blocks are then split into sub-blocks. This disclosure relates in some aspects to various apparatuses, systems, methods, and media for performing a read scrub on a physical block of NVM partitioned into sub-blocks. Here, it should be appreciated that different sub-blocks have different bias settings for their associated wordlines, so a read of one sub-block can cause problems for the other sub-blocks. Moreover, when a read operation is performed on a particular sub-block, the read operation is effectively performed on the entire block, which may cause a read disturb on other sub-blocks of the block.

Figure 2:
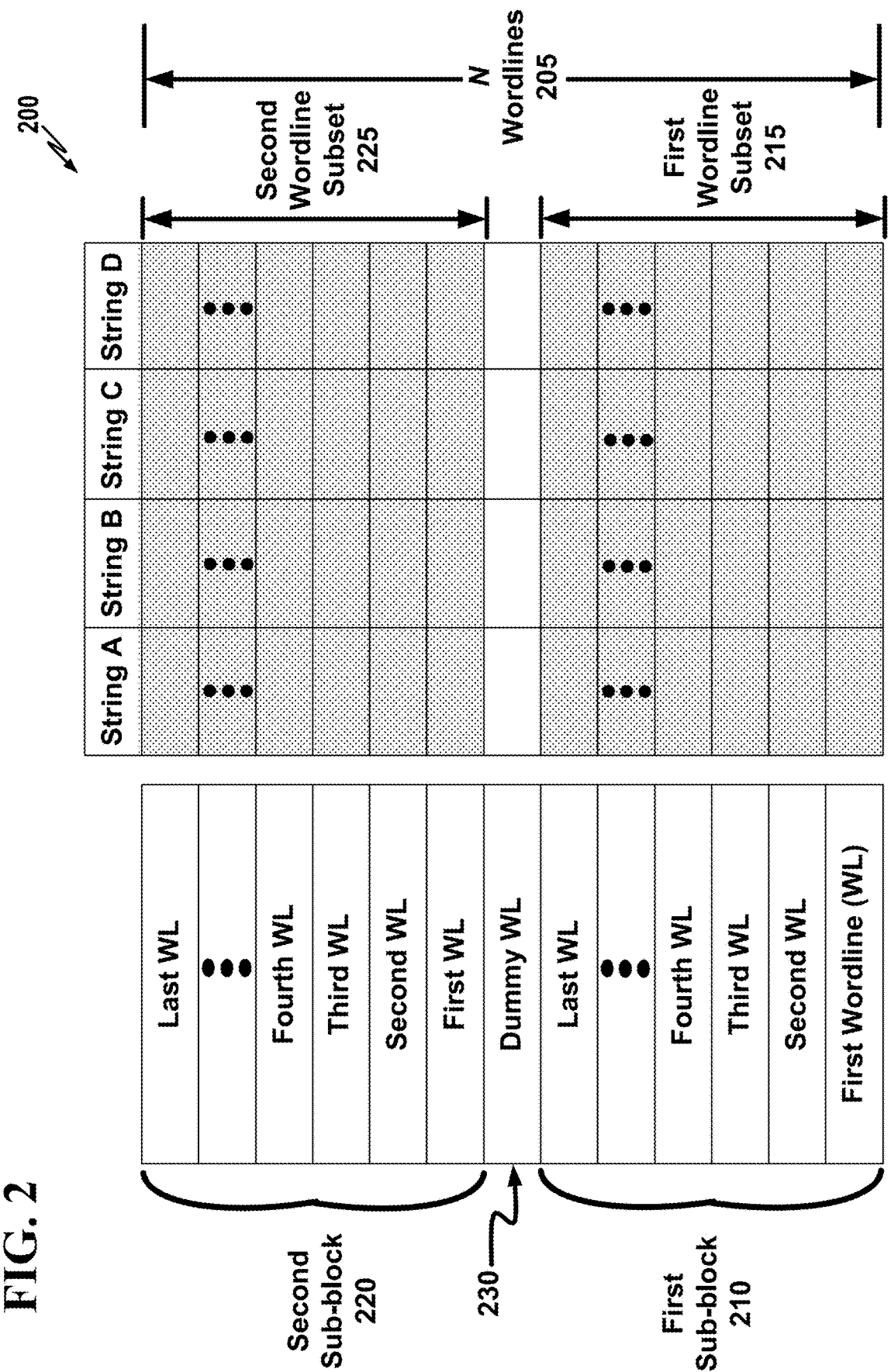
FIG. 2 illustrates a first exemplary sub-block architecture in accordance with one or more aspects of the disclosure.

For reference, an exemplary sub-block architecture is provided in FIG. 2. As illustrated, it is contemplated that a block 200 of NVM comprising N wordlines 205 may be partitioned into a first sub-block 210 comprising a first wordline subset 215 and a second sub-block 220 comprising a second wordline subset 220. Namely, although the first sub-block 210 and the second sub-block 220 reside on the same block 200, it is contemplated that they are physically separated from each other by a "dummy" wordline 230 and may be operated independently from each other. It is further contemplated that a dummy wordline, such as dummy wordline 230, can be physically the same as other wordlines, but configured to remain unprogrammed so as to separate sub-blocks from each other. Also, although only one dummy wordline 230 is shown in FIG. 2, it should be appreciated that multiple dummy wordlines can be included in a single block so as to further partition the block into more sub-blocks.

As used herein, the term "block" refers to a physical portion of an NVM that is the smallest addressable unit of the NVM. It should also be appreciated that the block, as used herein, may include two or more sub-blocks, wherein each sub-block may include two or more pages. Although a block is the smallest addressable unit of an NVM, it should be further appreciated that data can also be read and written at the page level. It is contemplated, however, that an erasure is typically performed only on the block level.

In an aspect of the disclosure, an SSD, a memory controller, a programmer device, or some other suitable device may be configured to determine whether operations performed on a target sub-block have adversely disturbed a sister sub-block. As used herein, a target sub-block refers to a sub-block in which an operation is performed (e.g., a read operation, a write operation, etc.), whereas a sister sub-block refers to a sub-block residing in a same block as a target sub-block. Aspects disclosed herein include performing a test on a target sub-block (e.g., first sub-block 210) to determine whether a read scrub of a sister sub-block (e.g., second sub-block 210) is appropriate.

For purposes of illustration, various aspects of the disclosure will be described in the context of a memory system that includes NAND memory technology, although one of ordinary skill in the art would appreciate that NOR memory technology may also be applicable. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

As previously stated, phenomena like program disturb, read disturb and data retention tend to affect the integrity of data stored in NAND arrays. Indeed, such phenomena can cause an undesirably high failed block count (FBC), and may eventually result in uncorrectable error correction code (UECC) events. To this end, although read scrub algorithms are designed to keep a check on the quality of data stored in each physical block of a NAND device, conventional read scrub algorithms are inadequate for architectures in which a physical block is logically partitioned into sub-blocks. Namely, when applied to a sub-block architecture, conventional read scrub methods will not suffice since a sister sub-block may experience a cumulative disturb effect from operations performed on a target sub block.

In view of the above deficiencies, the disclosure relates in some aspects to a read scrub design for a physical block of non-volatile memory (e.g., NAND memory) logically partitioned into sub-blocks. In some aspects, a sub-block read scrub design that utilizes a discrete read table, is disclosed. In other aspects, however, a sub-block read scrub design based on a periodic scan of the sub-blocks, is disclosed. These aspects and other aspects of the disclosure will now be described in more detail in conjunction with the Figures disclosed herein.

Figure 3:
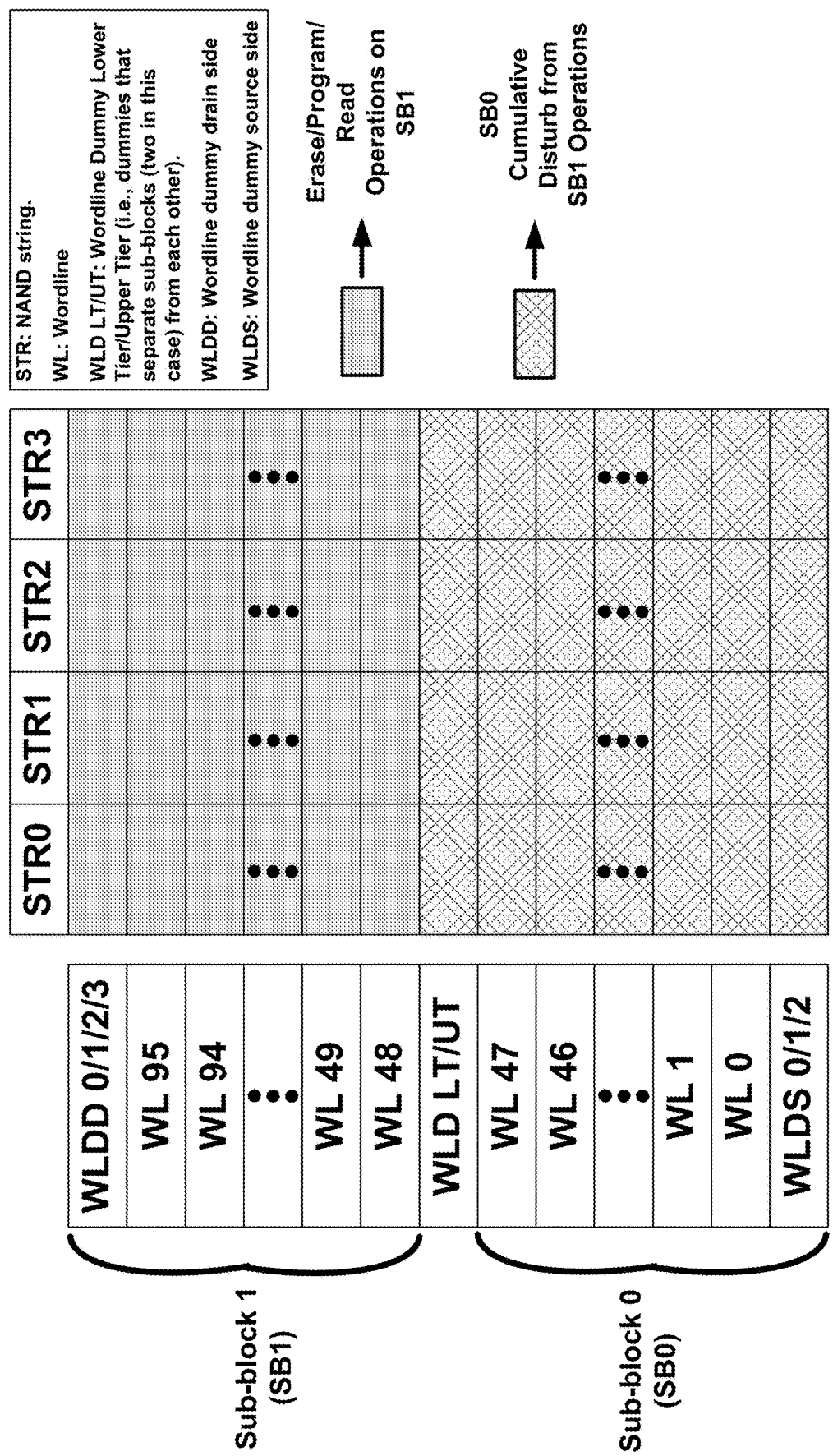
FIG. 3 illustrates a second exemplary sub-block architecture in accordance with one or more aspects of the disclosure.
Figure 4:
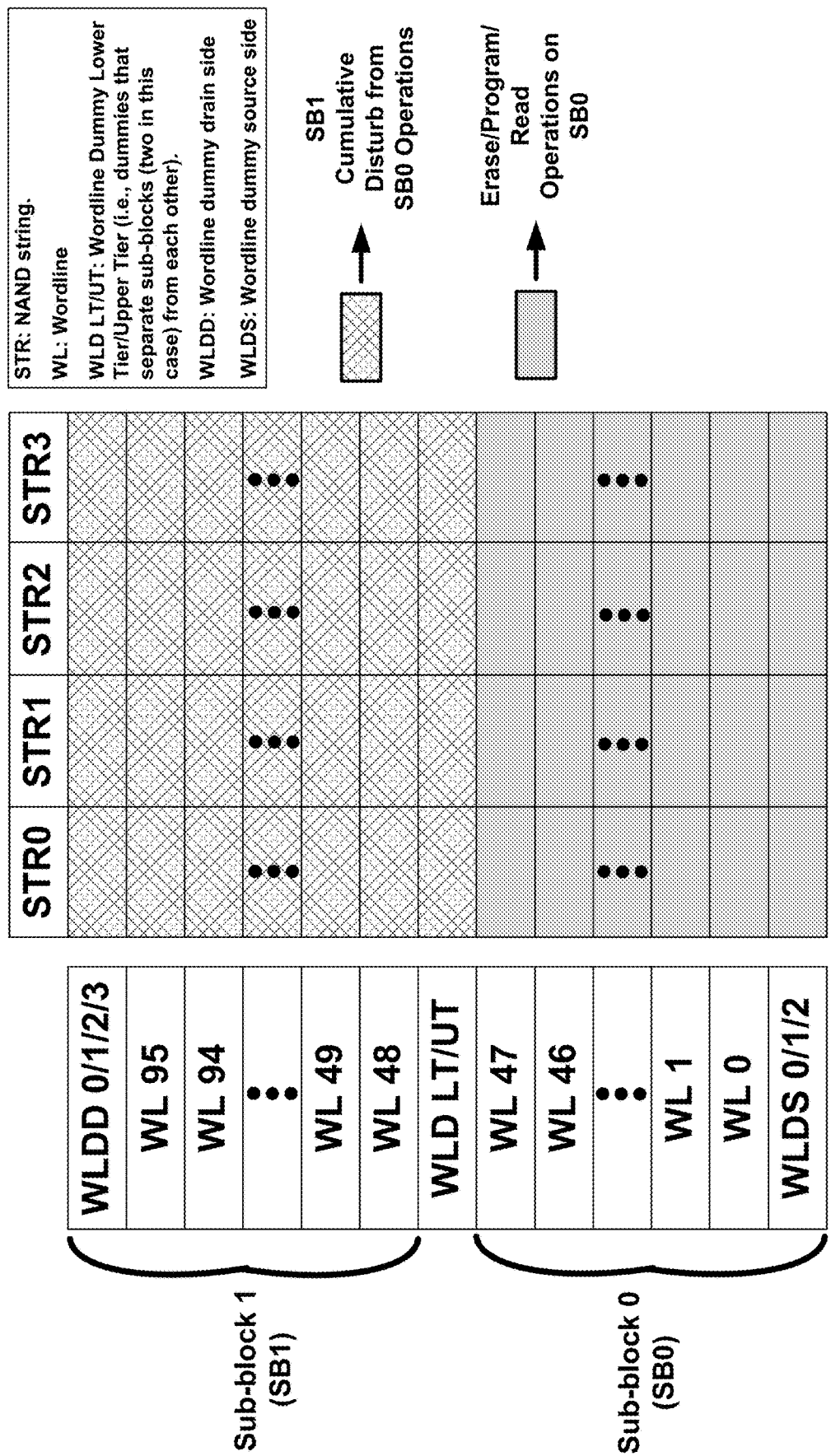
FIG. 4 illustrates a third exemplary sub-block architecture in accordance with one or more aspects of the disclosure.

Referring next to FIG. 3, an exemplary sub-block architecture is provided in accordance with one or more aspects of the disclosure. As illustrated, a physical block is logically partitioned into a first sub-block (i.e., sub-block 0) and a second sub-block (i.e., sub-block 1). Because of their physical proximity to each other, it is anticipated that sub-blocks residing in a same physical block will be particularly susceptible to read disturbs. For the architecture illustrated in FIG. 3, for instance, it is anticipated that erase, program, and/or read operations performed on sub-block 1 will have a cumulative disturb effect on the sub-block 0. Similarly, in FIG. 4, another exemplary sub-block architecture is provided in accordance with one or more aspects of the disclosure, wherein it is anticipated that erase, program, and/or read operations performed on sub-block 0 will have a cumulative disturb effect on the sub-block 1. For each of FIGS. 3 and 4, it should be appreciated that: "STR" refers to a NAND string; "WLD LT/UT" refers to Wordline Dummy Lower Tier/Upper Tier (i.e., dummies that separate sub-blocks (two in this case) from each other); "WLDD" refers to a Wordline dummy on the drain side; and "WLDS" refers to a Wordline dummy on the source side.

Example Sub-Block Read Scrub Operations Utilizing a Discrete Read Table

Figure 5:
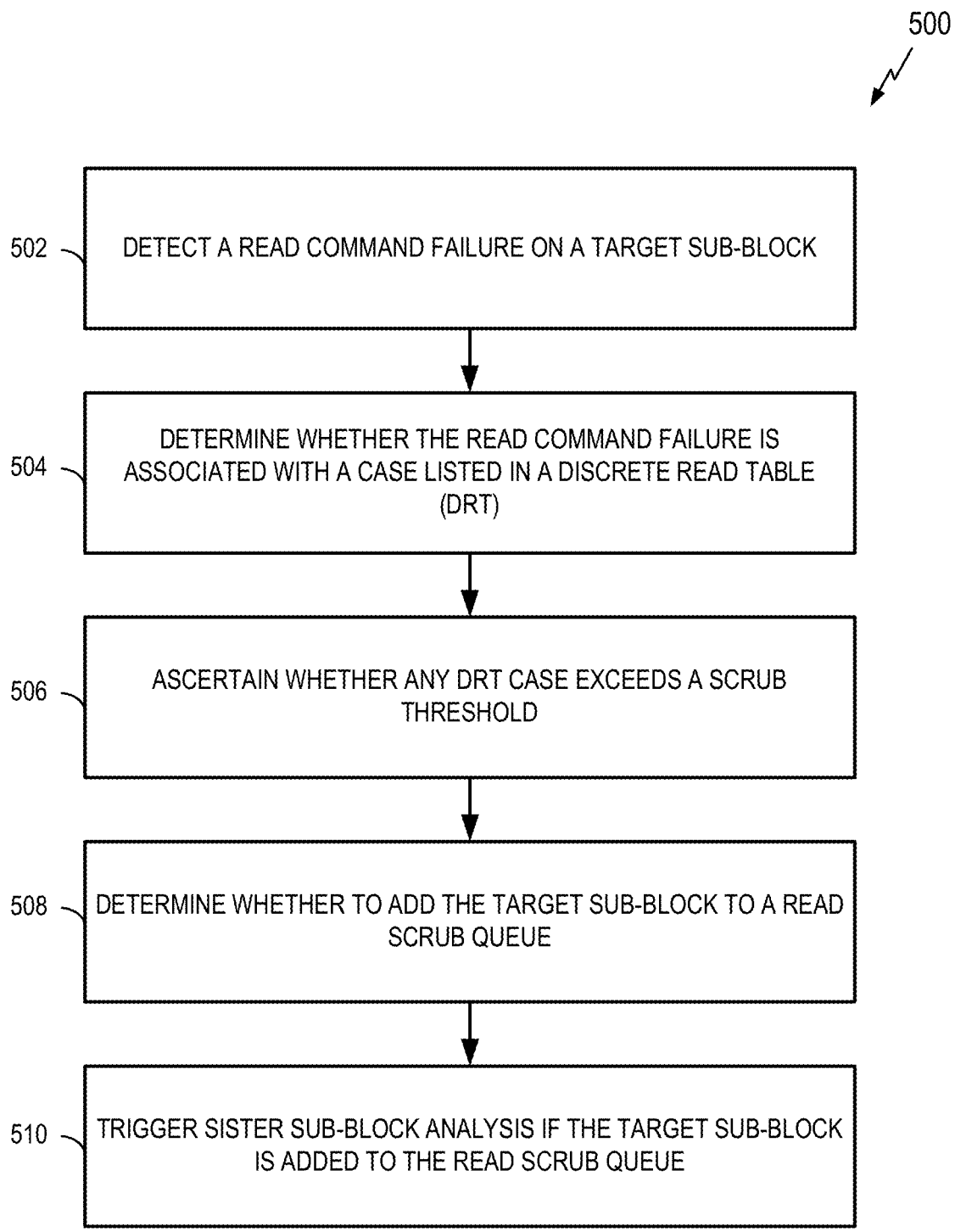
FIG. 5 illustrates exemplary operations for performing a target sub-block analysis utilizing a discrete read table in accordance with one or more aspects of the disclosure.

FIG. 5 illustrates an embodiment of operations 500 that may be performed to facilitate an exemplary read error handling (REH) sub-block read scrub that utilizes a discrete read table (DRT) in accordance with the teachings herein. The operations 500 may take place within an SSD, an SSD drive, or some other suitable apparatus or apparatuses. For example, one or more of these operations may be performed by the controller 208 (e.g., the sub-block read scrub circuit 214) of FIG. 2.

At block 502, a controller (or other suitable apparatus) detects a read command failure on a target sub-block. Namely, if the controller detects a read command failure (e.g., default read failure) on a target sub-block, a target sub-block analysis that utilizes a dynamic read table is triggered. An exemplary DRT is provided in Table 1 below, wherein the DRT includes various cases associated with different phenomena such as read disturb, data retention, and program disturb.

TABLE 1

Exemplary Discrete Read Table

| Configured File Slots | Scrub Trigger DRT Cases | DRTCase |
|---|---|---|
| 1 | 15 | Read Disturb |
| 2 | 16 | Read Disturb |
| 3 | 24 | Read Disturb |
| 4 | XX (Where XX is a case index value from the DRT table representative of read voltage shifts to reduce Data | Data Retention + Read Disturb |

TABLE 1-continued

Exemplary Discrete Read Table

| Configured File Slots | Scrub Trigger DRT Cases | DRTCase |
|---|---|---|
| 5 | Retention + Read Disturb influence) YY (Where YY is a case index value from the DRT table representative of read voltage shifts to reduce Program Disturb + Read Disturb influence) | Program Disturb + Read Disturb |

At block 504, the controller determines whether the read command failure is associated with a case listed in a DRT. Here, it should be appreciated that the DRT-based sub-block read scrub design disclosed herein operates on the principle that if any read passes from a particular set of DRT cases (i.e., a scrub trigger list), then the controller proceeds to block 506 where the controller ascertains whether any DRT case listed in the DRT table exceeds a scrub threshold. In a particular embodiment, if a failed bit count (FBC) is greater than the scrub threshold, the target sub-block is deemed to be at risk, wherein a read scrub may be triggered.

At block 508, the controller thus determines whether to add the target sub-block to a read scrub queue based on the scrub threshold comparison performed at block 506. At block 510, the controller then triggers a sister sub-block analysis if the target sub-block is added to the read scrub queue at block 508.

Here, it is noted that a challenge sub-block mode presents is that a sister sub-block can have valid data and be a closed block or a partially written block. Once it is determined that a target sub block will be placed in the read scrub queue, it is contemplated that further checks will be performed on the sister sub-block to ensure that the data in the sister sub-block has not been corrupted. In one aspect, this can be especially important within the context of a sub-block architecture where it is anticipated that read disturbs will be cumulative.

Figure 6:
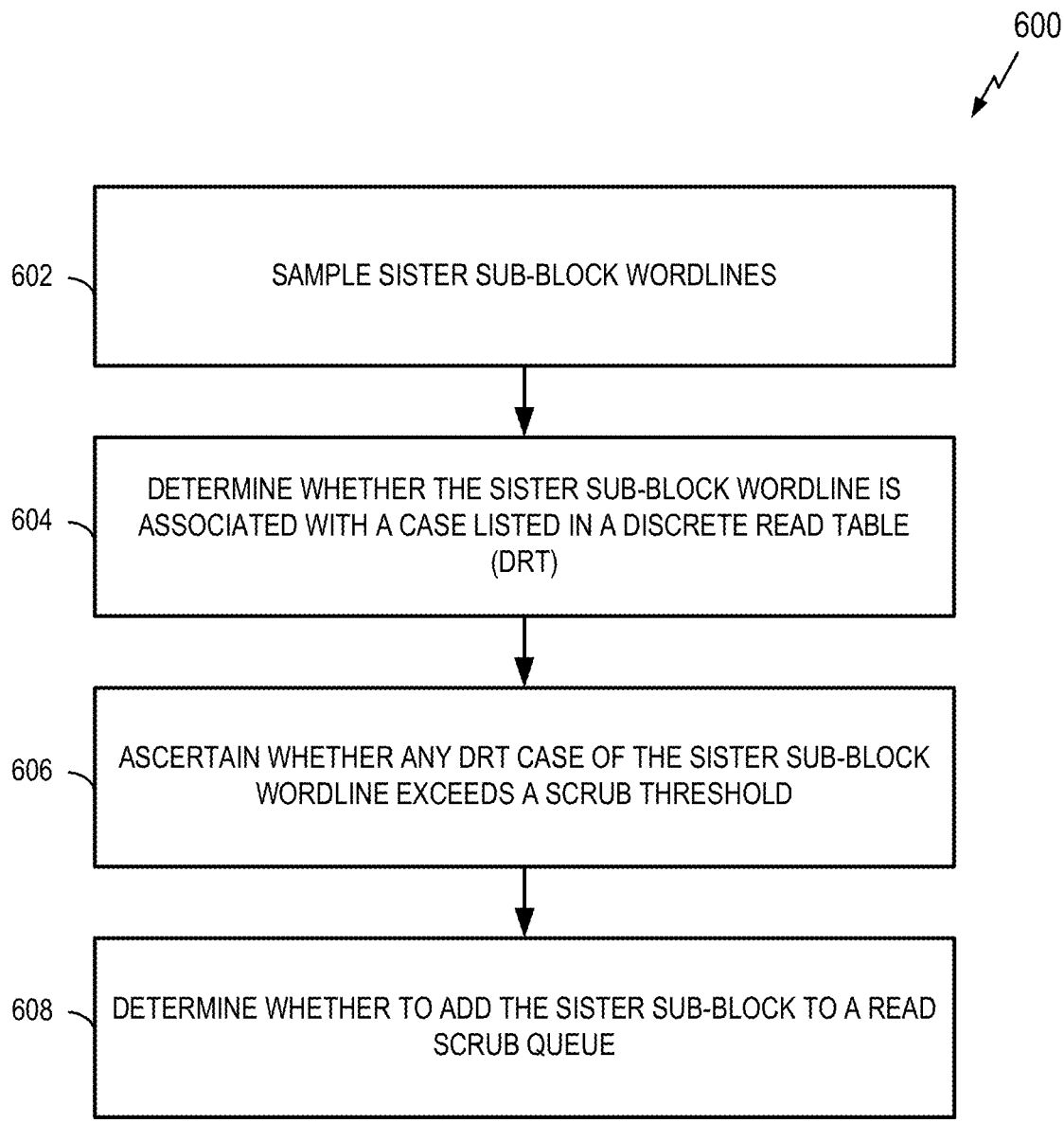
FIG. 6 illustrates exemplary operations for performing a sister sub-block analysis utilizing a discrete read table in accordance with one or more aspects of the disclosure.

Referring next to FIG. 6, exemplary operations are provided for performing a sister sub-block analysis utilizing a DRT in accordance with one or more aspects of the disclosure. The operations 600 may take place within a programmer device, an SSD, an SSD drive, or some other suitable apparatus or apparatuses. For example, one or more of these operations may be performed by a programmer device at a factory that manufactures an SSD, while other operations may be performed by the controller 108 (e.g., the sub-block read scrub circuit 214) of FIG. 2.

As disclosed herein, it is contemplated that the operations 600 are triggered upon determining that a target sub-block will be added to the scrub queue. In that case, assuming that the sister sub-block is not already in the read scrub queue, the operations 600 begin at block 602 with a controller (or other suitable apparatus) sampling sister sub-block wordlines. In a particular embodiment, at block 602, the worst set of wordlines on the sister sub-block are sampled in order to identify the most susceptible wordlines. For instance, in the case of an open block, the worst set of written wordlines are sampled at block 602. However, if none of the worst wordlines are written, it is contemplated that the $n^{th}-1$ wordline is sampled at block 602, wherein the $n^{th}$ wordline represents the last written wordline. Under these circumstances, it should be appreciated that the $n^{th}-1$ wordline is chosen since the $n^{th}$ wordline will have a higher FBC.

If the worst set of wordlines fail for default, and require a dynamic read to pass, then the controller crosschecks whether this dynamic read case is part of the scrub trigger list included in the DRT. Namely, at block 604, the controller determines whether the sister sub-block wordline is associated with a case listed in the DRT. At block 606, the controller then ascertains whether any DRT case of the sister sub-block wordline exceeds a scrub threshold. For instance, block 606 may include having the controller ascertain whether the FBC is greater than the scrub threshold. If so, the sister sub-block is then added to the read scrub queue at block 608.

Example Sub-Block Read Scrub Operations Utilizing a Periodic Scan

Figure 7:
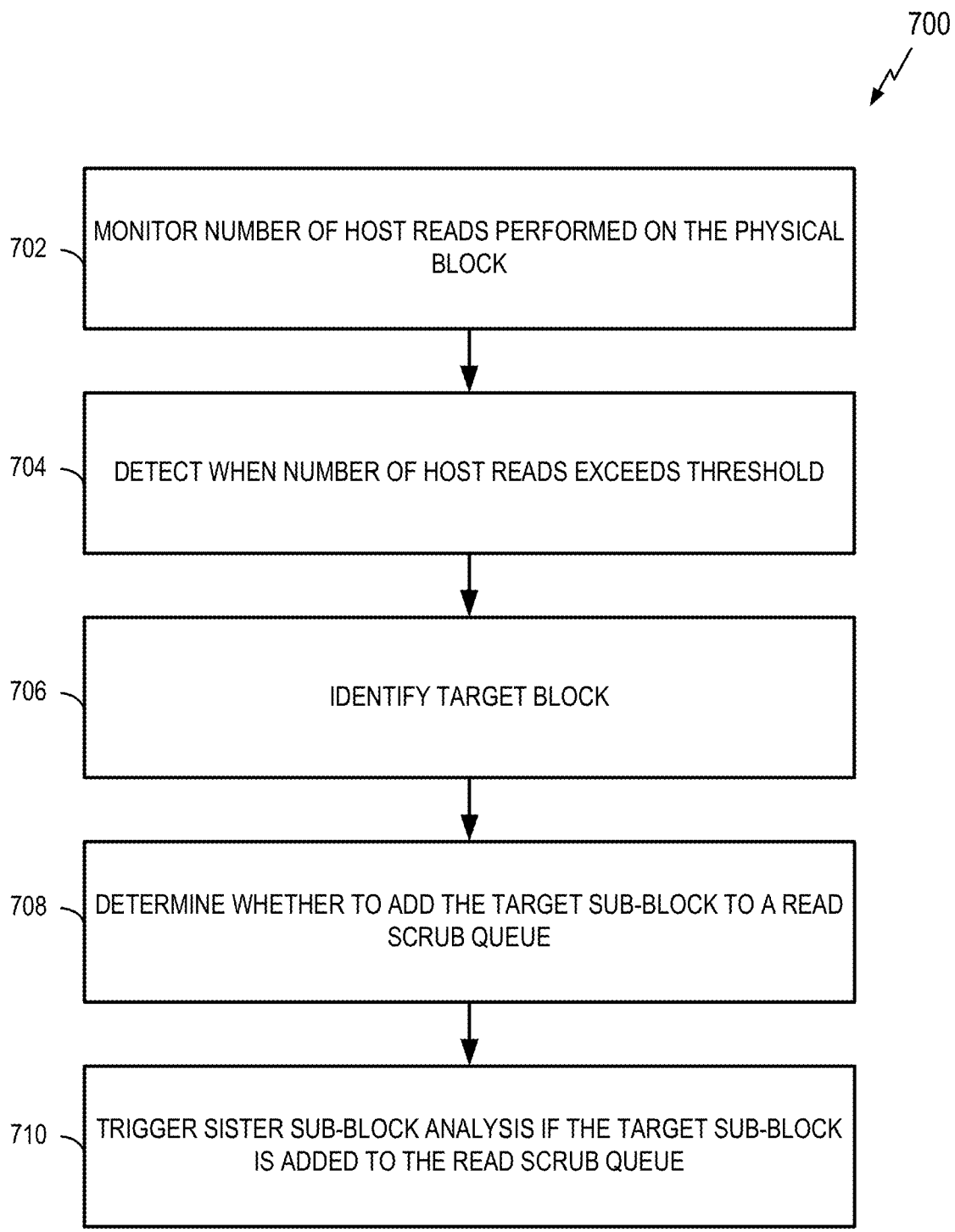
FIG. 7 illustrates exemplary operations for performing a target sub-block analysis utilizing a periodic scan methodology in accordance with one or more aspects of the disclosure.

FIG. 7 illustrates an embodiment of operations 700 that may be performed to facilitate an exemplary sub-block read scrub that utilizes a periodic scan in accordance with the teachings herein. The operations 700 may take place within an SSD, an SSD drive, or some other suitable apparatus or apparatuses. For example, one or more of these operations may be performed by the controller 208 (e.g., the sub-block read scrub circuit 214) of FIG. 2.

For this embodiment, it should be noted that the disclosed periodic scan is a probabilistic check which is triggered after every $n^{th}$ host read. Accordingly, at block 702, a controller (or other suitable apparatus) monitors the number of host reads performed on the physical block, and detects when the number of host reads exceeds a threshold number of reads at block 704.

At block 706, the controller then identifies the target sub-block. Here, since read counters may not exist per meta-block, the controller may identify the target sub-block based on where the $n^{th}$ host read lands, wherein the $n^{th}$ host read is the first host read that exceeds the threshold number of reads. Since it is contemplated that the physical block is logically partitioned into a first and second sub-block, the periodic check will thus be performed on which of the first or second sub-blocks the $n^{th}$ host read lands, wherein that sub-block is identified as the target sub-block for that particular scan.

Once the target sub-block has been identified at block 706, the controller determines whether to add the target sub-block to a read scrub queue at block 708. Here, assuming that the target sub-block is not already in the scrub queue, the controller will scan the wordline where the read falls (i.e., $WL_n$), as well each of the wordlines that neighbor $WL_n$ (i.e., $WL_{n-1}$ and $WL_{n+1}$). If the FBC for any of $WL_n$, $WL_{n-1}$, or $WL_{n+1}$ is greater than a scrub threshold, then the controller performs a worst wordline check for the target sub-block. If the worst wordline check fails, then the target sub-block is added to the read scrub queue at block 708. At block 710, the controller then triggers a sister sub-block analysis if the target sub-block is added to the read scrub queue at block 708.

Figure 8:
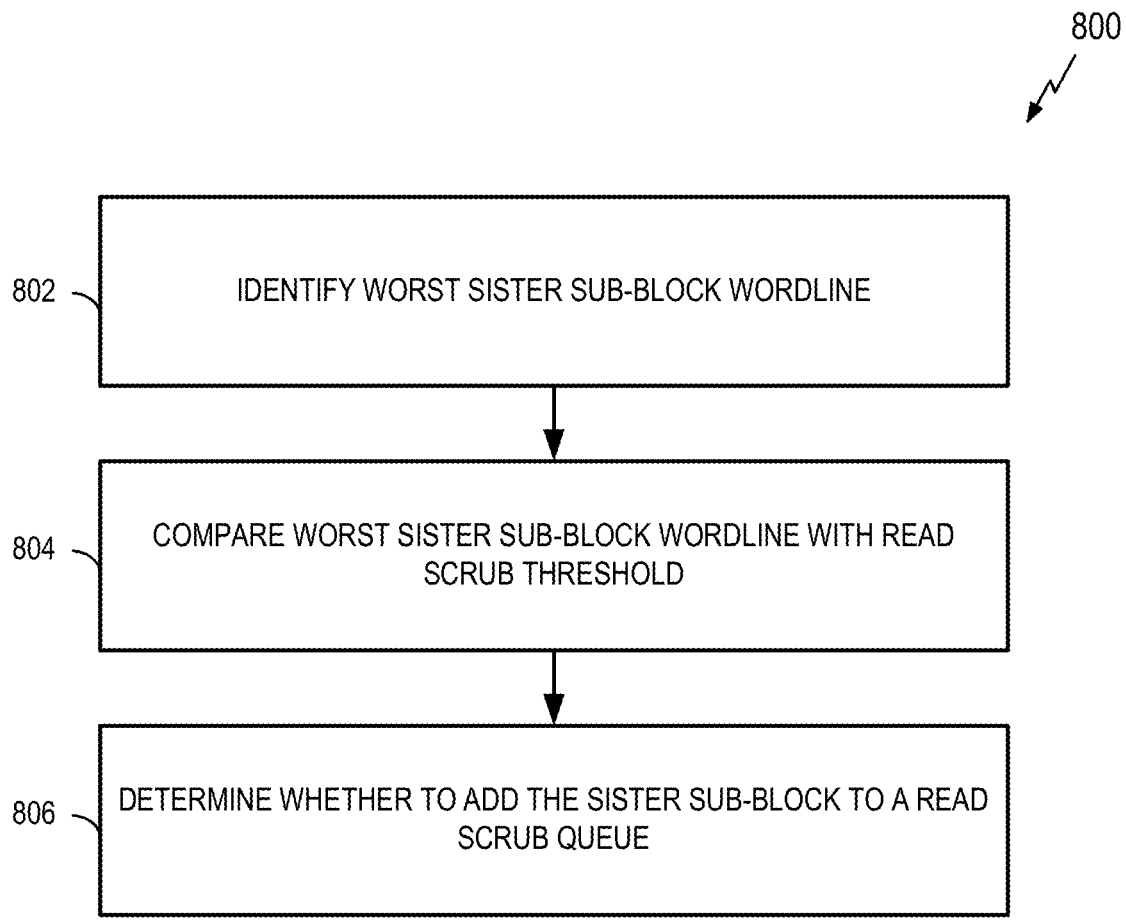
FIG. 8 illustrates exemplary operations for performing a sister sub-block analysis utilizing a periodic scan methodology in accordance with one or more aspects of the disclosure.

Referring next to FIG. 8, exemplary operations are provided for performing a sister sub-block analysis utilizing a periodic scan in accordance with one or more aspects of the disclosure. The operations 800 may take place within a programmer device, an SSD, an SSD drive, or some other suitable apparatus or apparatuses. For example, one or more of these operations may be performed by a programmer device at a factory that manufactures an SSD, while other operations may be performed by the controller 208 (e.g., the sub-block read scrub circuit 214) of FIG. 2.

Once the target sub-block has been added to the read scrub queue, the sister sub-block is scanned via the operations 800 to ensure data integrity. Assuming the sister sub-block is not already in the read scrub queue (in which case a foreground scrubbing will be performed), the worst wordline of the sister sub-block is identified for scanning at block 802. If the worst wordline has not been written, the controller may select the $n^{th}-1$ wordline at block 802, wherein the $n^{th}$ wordline represents the last written wordline of the sister sub-block. At block 804, the controller then compares the sister sub-block wordline selected at block 802 with a read scrub threshold. For instance, if the FBC of the sister sub-block wordline selected at block 802 is greater than the read scrub threshold, then the sister sub-block is added to the read scrub queue at block 806. Here, because this is a foreground scan, it should be noted choosing the frequency of operation such that it does not impact the performance may be desirable. Also, for reference purposes, exemplary periodic scan parameters are provided in Table 2 below.

TABLE 2

Exemplary Periodic Scan Parameters

| Parameter Name | Description |
| --- | --- |
| Periodic Scan Start | Triggered after a certain number of reads has taken place (e.g., every 1000 reads) instead of evaluating after every read. This desirably reduces the number of times the scan is invoked thus reducing performance impact. |
| Host Command Trigger | Number of host read commands to trigger periodic scan |
| Number of Wordlines to Scan | Wordlines to scan other than immediate neighbor in the sub-block |
| Periodic Scan Wordline Number (multiple bytes) | Actual wordline numbers to scan |
| Scrub Threshold | Threshold per 2K |

Example Data Storage Device

Figure 9:
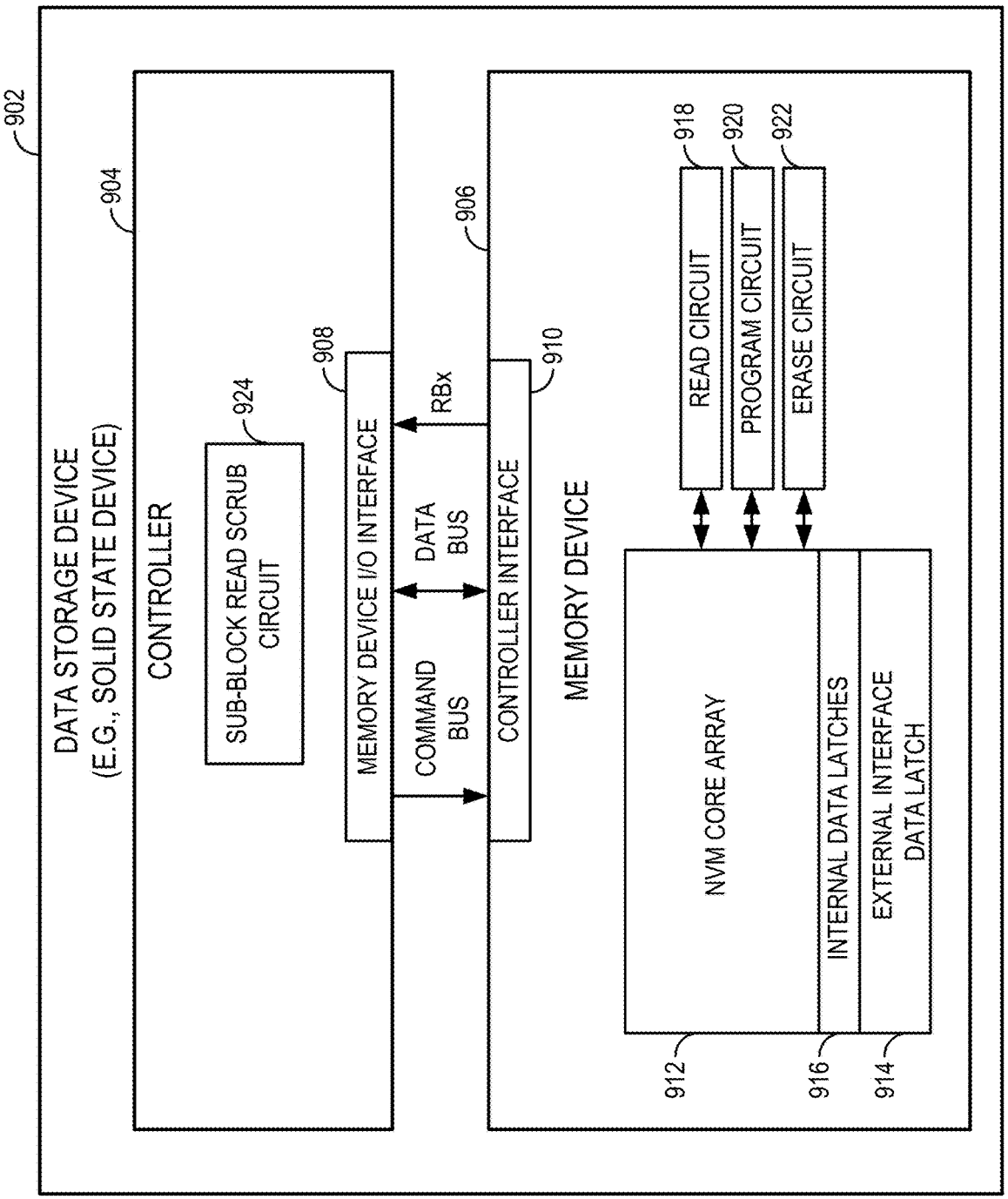
FIG. 9 illustrates an example data storage device (e.g., an SSD) configured in accordance with one or more aspects of the disclosure.

FIG. 9 illustrates an embodiment of a data storage device 902 (e.g., an SSD drive) that may perform read scrubs on sub-blocks as taught herein. The data storage device includes a controller 904 that writes data to and reads data from a memory device 906 (e.g., an NVM), and performs other associated data storage operations.

The controller 904 and the memory device 906 communicate with one another via corresponding interfaces. The controller 904 includes a memory device input/output (I/O) interface 908 for sending commands to the memory device (e.g., via a command bus), sending data to and receiving data from the memory device 906 (e.g., via a data bus), and for sending and receiving other signaling as applicable (e.g., a read/busy indication (RBx) generated by the memory device 906). Similarly, the memory device 906 includes a controller interface 910 for receiving commands from the controller 904 (e.g., via a command bus), sending data to and receiving data from the controller 904 (e.g., via a data bus), and for sending and receiving other signaling as applicable (e.g., RBx).

The memory device 906 includes an NVM core array 912 for storing data, an external interface data latch 914 for outputting stored data to and receiving data to be stored from the controller interface 910, and a set of internal data latches 916 for storing operational data that is used by the memory device 906. The memory device 906 also includes a read circuit 918 for reading data from the multi-tier NVM core array 912, a program circuit 920 for writing data to the multi-tier NVM core array 912, and an erase circuit 922 for erasing data in the multi-tier NVM core array 912.

In accordance with the teachings herein, the controller 904 includes a sub-block read scrub circuit 924 that may be configured to perform one or more of the operations described herein. For example, the sub-block read scrub circuit 924 may correspond to the sub-block read scrub circuit 214 of FIG. 2 and perform one or more of the sub-block read scrub operations described herein in conjunction with FIGS. 1-8 and 10-12.

Alternative Sub-Block Read Scrub Devices

Figure 10:
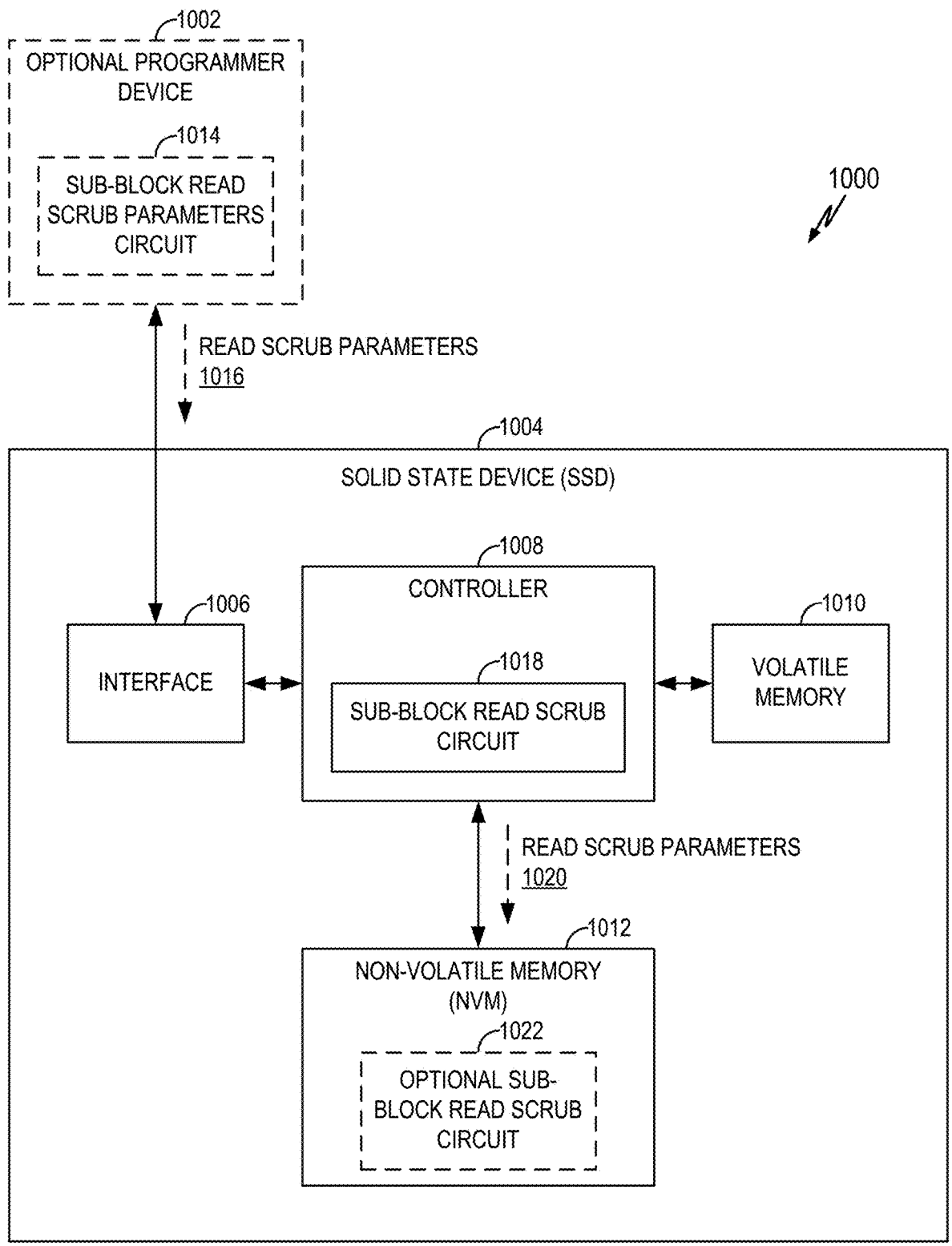
FIG. 10 illustrates an example of different devices for performing a sub-block read scrub in accordance with one or more aspects of the disclosure.

The sub-block read scrub operations described herein may be performed by different devices in different implementations. The system 1000 of FIG. 10 depicts an optional programmer device 1002, and an SSD 1004 communicatively coupled to the programmer device 1002. The SSD 1004 includes an interface 1006, a controller 1008, a volatile memory 1010, and a non-volatile memory (NVM) 1012.

The programmer device 1002 may be used, for example, during the manufacturing or testing of the SSD 1004. The programmer device 1002 includes a sub-block read scrub parameters circuit 1014 for ascertaining read scrub parameters 1016 for performing a read scrub on the SSD 1004 when the NVM 1012 is logically partitioned into sub-blocks.

In an embodiment that includes the programmer device 1002, a sub-block read scrub circuit 1018 of the controller 1008 may select the set of read scrub parameters 1020 to be used by the NVM 1012 and send the selected set of read scrub parameters 1020 to the NVM 1012. For example, the sub-block read scrub circuit 1018 may select the set of read scrub parameters 1020 so as to trigger a particular type of read scrub based on particular preferences (e.g., whether detection of a particular type of disturb pattern is desired).

In some embodiments, the NVM 1012 may include an optional sub-block read scrub circuit 1022 for configuring the NVM 1012 in accordance with the read scrub parameters 1020. For example, the optional sub-block read scrub circuit 1022 may implement a particular type of read scrub based on a preferred type of sub-block read scrub (e.g., whether detection of a particular type of disturb pattern is desired). For instance, the optional sub-block read scrub circuit 1022 may implement a read scrub that utilizes a dynamic read table (DRT) to analyze a particular wordline upon detecting that a default read operation on a target sub-block has failed. In another aspect disclosed herein, the optional sub-block read scrub circuit 1022 may implement a read scrub in which a particular wordline, plus its neighboring wordlines, are periodically scanned upon detecting that a threshold number of reads have been performed on the NVM 1012.

First Example Apparatus

Figure 11:
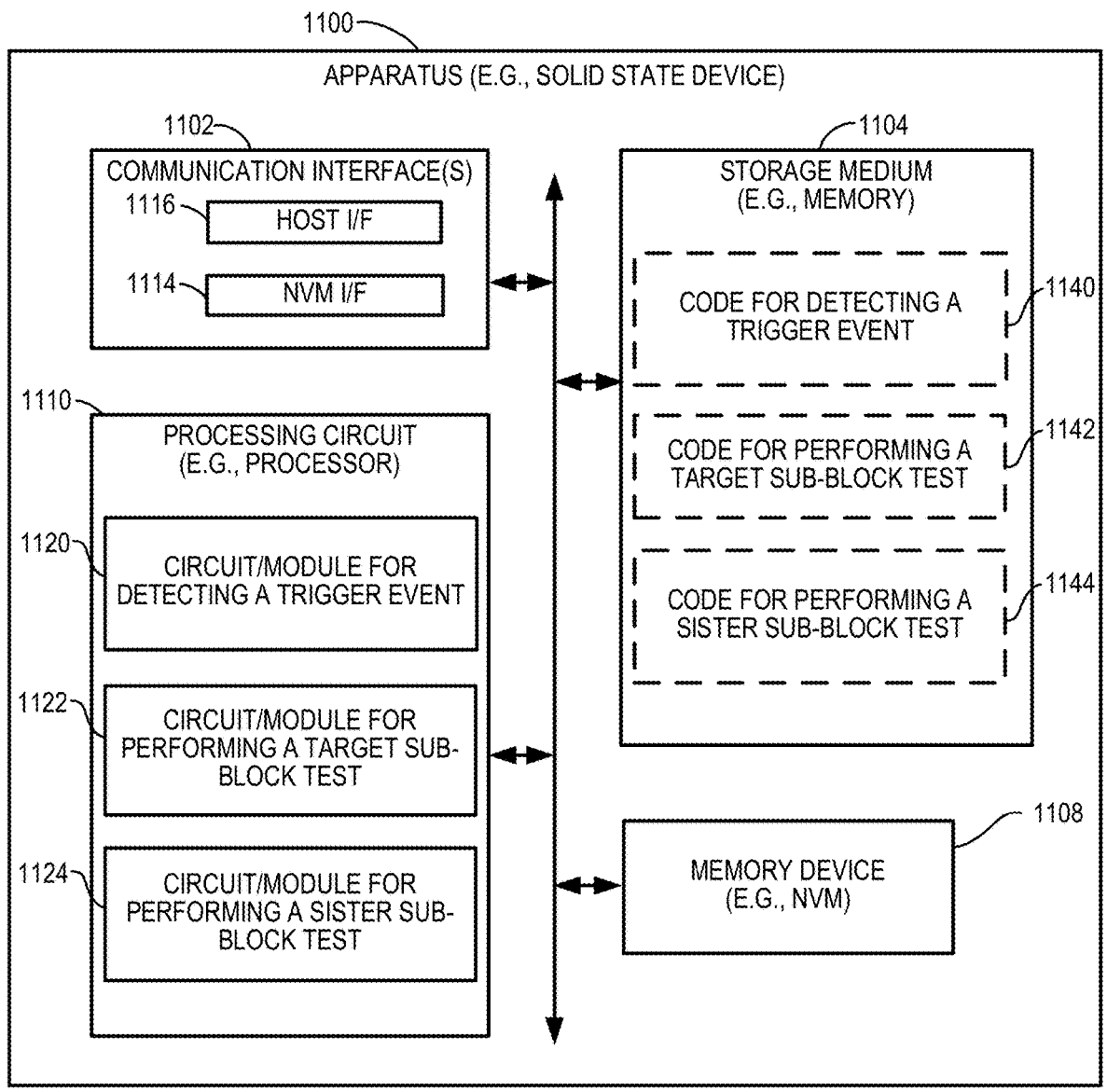
FIG. 11 illustrates an example hardware implementation for an apparatus (e.g., an electronic device) for controlling data storage in accordance with one or more aspects of the disclosure.

FIG. 11 illustrates an embodiment of an apparatus 1100 configured to communicate according to one or more aspects of the disclosure. The apparatus 1100 could embody or be implemented within a memory controller, an SSD, an SSD drive, a host device, an NVM device, a NAND die, or some other type of device that supports data storage. In various implementations, the apparatus 1100 could embody or be implemented within a computing device, a personal computer, a portable device, or workstation, a server, a personal digital assistant, a digital camera, a digital phone, an entertainment device, a medical device, or any other electronic device that stores data.

The apparatus 1100 includes a communication interface 1102, a storage medium 1104, a memory device (e.g., an NVM memory circuit) 1108, and a processing circuit 1110 (e.g., at least one processor and/or other suitable circuitry). These components can be coupled to and/or placed in electrical communication with one another via a signaling bus or other suitable component, represented generally by the connection lines in FIG. 11. The signaling bus may include any number of interconnecting buses and bridges depending on the specific application of the processing circuit 1110 and the overall design constraints. The signaling bus links together various circuits such that each of the communication interface 1102, the storage medium 1104, and the memory device 1108 are coupled to and/or in electrical communication with the processing circuit 1110. The signaling bus may also link various other circuits (not shown) such as timing sources, peripherals, voltage regulators, and power management circuits, which are well known in the art, and therefore, will not be described any further.

The communication interface 1102 provides a means for communicating with other apparatuses over a transmission medium. In some implementations, the communication interface 1102 includes circuitry and/or programming (e.g., a program) adapted to facilitate the communication of information bi-directionally with respect to one or more devices in a system. In some implementations, the communication interface 1102 may be configured for wire-based communication. For example, the communication interface 1102 could be a bus interface, a send/receive interface, or some other type of signal interface including drivers, buffers, or other circuitry for outputting and/or obtaining signals (e.g., outputting signal from and/or receiving signals into an integrated circuit). The communication interface 1102 serves as one example of a means for receiving and/or a means for transmitting.

The memory device 1108 may represent one or more memory devices. As indicated, the memory device 1108 may maintain mapping information 1118 along with other information used by the apparatus 1100. In some implementations, the memory device 1108 and the storage medium 1104 are implemented as a common memory component. The memory device 1108 may also be used for storing data that is manipulated by the processing circuit 1110 or some other component of the apparatus 1100.

The storage medium 1104 may represent one or more computer-readable, machine-readable, and/or processor-readable devices for storing programming, such as processor executable code or instructions (e.g., software, firmware), electronic data, databases, or other digital information. The storage medium 1104 may also be used for storing data that is manipulated by the processing circuit 1110 when executing programming. The storage medium 1104 may be any available media that can be accessed by a general purpose or special purpose processor, including portable or fixed storage devices, optical storage devices, and various other mediums capable of storing, containing or carrying programming.

By way of example and not limitation, the storage medium 1104 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1104 may be embodied in an article of manufacture (e.g., a computer program product). By way of example, a computer program product may include a computer-readable medium in packaging materials. In view of the above, in some implementations, the storage medium 1104 may be a non-transitory (e.g., tangible) storage medium. For example, the storage medium 1104 may be a non-transitory computer-readable medium storing computer-executable code, including code to perform operations as described herein.

The storage medium 1104 may be coupled to the processing circuit 1110 such that the processing circuit 1110 can read information from, and write information to, the storage medium 1104. That is, the storage medium 1104 can be coupled to the processing circuit 1110 so that the storage medium 1104 is at least accessible by the processing circuit 1110, including examples where at least one storage medium is integral to the processing circuit 1110 and/or examples where at least one storage medium is separate from the processing circuit 1110 (e.g., resident in the apparatus 1100, external to the apparatus 1100, distributed across multiple entities, etc.).

Programming stored by the storage medium 1104, when executed by the processing circuit 1110, causes the processing circuit 1110 to perform one or more of the various functions and/or process operations described herein. For example, the storage medium 1104 may include operations configured for regulating operations at one or more hardware blocks of the processing circuit 1110, as well as to utilize the communication interface 1102 for wireless communication utilizing their respective communication protocols.

The processing circuit 1110 is generally adapted for processing, including the execution of such programming stored on the storage medium 1104. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1110 is arranged to obtain, process and/or send data, control data access and storage, issue commands, and control other desired operations. The processing circuit 1110 may include circuitry configured to implement desired programming provided by appropriate media in at least one example. For example, the processing circuit 1110 may be implemented as one or more processors, one or more controllers, and/or other structure configured to execute executable programming. Examples of the processing circuit 1110 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1110 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1110 are for illustration and other suitable configurations within the scope of the disclosure are also contemplated.

According to one or more aspects of the disclosure, the processing circuit 1110 may be adapted to perform any or all of the features, processes, functions, operations and/or routines for any or all of the apparatuses described herein. For example, the processing circuit 1110 may be configured to perform any of the steps, functions, and/or processes described with respect to FIGS. 1-10, and 12. As used herein, the term "adapted" in relation to the processing circuit 1110 may refer to the processing circuit 1110 being one or more of configured, employed, implemented, and/or programmed to perform a particular process, function, operation and/or routine according to various features described herein.

The processing circuit 1110 may be a specialized processor, such as an application-specific integrated circuit (ASIC) that serves as a means for (e.g., structure for) carrying out any one of the operations described in conjunction with FIGS. 1-10, and 12. The processing circuit 1110 serves as one example of a means for sending and/or a means for receiving. In various implementations, the processing circuit 1110 may provide and/or incorporate, at least in part, the functionality described above for the controller 208 or the SSD 204 of FIG. 2.

According to at least one example of the apparatus 1100, the processing circuit 1110 may include one or more of a circuit/module for detecting a trigger event 1120, a circuit/module for performing a target sub-block test 1122, or a circuit/module for performing a sister sub-block test 1124. In various implementations, the circuit/module for detecting a trigger event 1120, the circuit/module for performing a target sub-block test 1122, or the circuit/module for performing a sister sub-block test 1124 may provide and/or incorporate, at least in part, the functionality described above for the controller 208 of FIG. 2.

As mentioned above, a program stored by the storage medium 1104, when executed by the processing circuit 1110, causes the processing circuit 1110 to perform one or more of the various functions and/or process operations described herein. For example, the program may cause the processing circuit 1110 to perform the various functions, steps, and/or processes described herein with respect to FIGS. 1-10, and 12 in various implementations. As shown in FIG. 11, the storage medium 1104 may include one or more of code for detecting a trigger event 1140, code for performing a target sub-block test 1142, or code for performing a sister sub-block test 1144. In various implementations, the code for detecting a trigger event 1140, the code for performing a target sub-block test 1142, or the code for performing a sister sub-block test 1144 may be executed or otherwise used to provide the functionality described herein for the circuit/module for detecting a trigger event 1120, the circuit/module for performing a target sub-block test 1122, or the circuit/module for performing a sister sub-block test 1124.

In a particular implementation, it is contemplated that the memory device 1108 is an NVM device, wherein the apparatus 1100 is configured to perform a read scrub on a block of the NVM comprising N wordlines partitioned into a first sub-block (e.g., a target sub-block) comprising a first subset of the N wordlines and a second sub-block (e.g., a sister sub-block) comprising a second subset of the N wordlines different than the first subset. For instance, in an exemplary embodiment, the first sub-block and the second sub-block are separated (e.g., physically separated) by at least one dummy wordline (See e.g., dummy wordline 230, FIG. 2), wherein the at least one dummy wordline is configured to remain unprogrammed. In one aspect, NVM circuitry (e.g., a processor, a controller, or similar such circuitry) that resides within the NVM device and controls blocks of the device may be configured to ensure that the at least one dummy wordline remains unprogrammed. Furthermore, it should be appreciated that the first subset of the N wordlines and the second subset of the N wordlines may be mutually exclusive. It is also contemplated that the circuit/module for detecting a trigger event 1120 and/or the code for detecting a trigger event 1140 are configured to detect a trigger event associated with a read command performed on the first sub-block. It is further contemplated that the circuit/module for performing a target sub-block test 1122 and/or the code for performing a target sub-block test 1142 are configured to perform a target sub-block test, in response to a detection of the trigger event, to determine whether to add the first sub-block to a read scrub queue. And finally, it is contemplated that the circuit/module for performing a sister sub-block test 1124 and/or the code for performing a sister sub-block test 1144 are configured to perform a sister sub-block test, in response to an addition of the first sub-block to the read scrub queue, to determine whether to add the second sub-block to the read scrub queue.

As previously mentioned, aspects disclosed herein include a sub-block read scrub design that utilizes a discrete read table (DRT). Within an exemplary implementation of such design, it should be appreciated that the aforementioned trigger event may be a read error associated with the read command, wherein the circuit/module for detecting a trigger event 1120 and/or the code for detecting a trigger event 1140 may be configured to detect the read error. For this embodiment, it is contemplated that either of the circuit/module for performing a target sub-block test 1122, the code for performing a target sub-block test 1142, the circuit/module for performing a sister sub-block test 1124, and/or the code for performing a sister sub-block test 1144, may be configured to access a DRT that includes aspects associated with at least one scrub trigger case (e.g., aspects corresponding to at least one of a read disturb case, a program disturb case, or a data retention case).

In an exemplary embodiment of the DRT-based read scrub design disclosed herein, it is contemplated that either of the circuit/module for performing a target sub-block test 1122, the code for performing a target sub-block test 1142, the circuit/module for performing a sister sub-block test 1124, and/or the code for performing a sister sub-block test 1144, may be configured to perform a determination of whether the read command is associated with at least one scrub trigger case listed in the DRT, and then determine whether to add at least one of the first sub-block or the second sub-block to the read scrub queue based on the determination. For instance, the DRT may include a corresponding scrub trigger threshold for the at least one scrub trigger case, wherein the apparatus 1100 is configured to add the at least one of the first sub-block or the second sub-block to the read scrub queue based on whether the corresponding scrub trigger threshold for the at least one scrub trigger case is exceeded. Moreover, in an exemplary embodiment, it is contemplated that either of the circuit/module for performing a target sub-block test 1122, the code for performing a target sub-block test 1142, the circuit/module for performing a sister sub-block test 1124, and/or the code for performing a sister sub-block test 1144, may be configured to ascertain a corresponding scrub trigger threshold of the at least one scrub trigger case, and determine whether to add the at least one of the first sub-block or the second sub-block to the read scrub queue based on whether the corresponding scrub trigger threshold is exceeded.

Particular aspects directed towards performing a target sub-block test, in accordance with the DRT-based read scrub design disclosed herein, are also contemplated. For instance, it is contemplated that the circuit/module for performing a target sub-block test 1122 and/or the code for performing a target sub-block test 1142 are configured to identify a target sub-block wordline in the first sub-block corresponding to the read command. The circuit/module for performing a target sub-block test 1122 and/or the code for performing a target sub-block test 1142 may then be further configured to perform a target sub-block comparison of aspects associated with the target sub-block wordline and the corresponding scrub trigger threshold for the at least one scrub trigger case, wherein a determination of whether to add the first sub-block to the read scrub queue is based on the target sub-block comparison.

Similarly, particular aspects directed towards performing a sister sub-block test, in accordance with the DRT-based read scrub design disclosed herein, are also contemplated. For instance, it is contemplated that the circuit/module for performing a sister sub-block test 1124 and/or the code for performing a sister sub-block test 1144 may be configured to identify a sister sub-block wordline in the second sub-block having a worst wordline quality amongst all sub-block wordlines of the second sub-block. The circuit/module for performing a sister sub-block test 1124 and/or the code for performing a sister sub-block test 1144 may then be further configured to perform a sister sub-block comparison of aspects associated with the sister sub-block wordline and the corresponding scrub trigger threshold for the at least one scrub trigger case, wherein a determination of whether to add the second sub-block to the read scrub queue is based on the sister sub-block comparison.

As previously mentioned, aspects disclosed herein also include a sub-block read scrub design that utilizes a periodic scan. Within an exemplary implementation of such design, it should be appreciated that the circuit/module for detecting a trigger event 1120 and/or the code for detecting a trigger event 1140 may be configured to detect when a threshold number of read commands on a physical block of the memory device 1108 is exceeded. Once this trigger event is detected, it is contemplated that the circuit/module for performing a target sub-block test 1122 and/or the code for performing a target sub-block test 1142 may be configured to identify the first sub-block as a target sub-block based on whether the read command corresponds to a wordline in the first or second sub-block of the memory device 1108. Namely, the circuit/module for performing a target sub-block test 1122 and/or the code for performing a target sub-block test 1142 is configured to identify the sub-block as a target sub-block based on whether the read command lands on the first or second sub-block of the memory device 1108.

Particular aspects directed towards performing a target sub-block test, in accordance with the periodic scan-based read scrub design disclosed herein, are contemplated. For instance, it is contemplated that the circuit/module for performing a target sub-block test 1122 and/or the code for performing a target sub-block test 1142 are configured to determine a wordline quality of a target sub-block wordline in the first sub-block corresponding to the read command and at least one neighboring wordline of the target sub-block wordline. The circuit/module for performing a target sub-block test 1122 and/or the code for performing a target sub-block test 1142 may then be further configured to compare the wordline quality of either the target sub-block wordline or the at least one neighboring wordline to a scrub trigger threshold. A sister sub-block test is then performed in response to a determination that the wordline quality of either the wordline or the at least one neighboring wordline is below the scrub trigger threshold.

Particular aspects directed towards performing a sister sub-block test, in accordance with the periodic scan-based read scrub design disclosed herein, are also contemplated. For instance, it is contemplated that the circuit/module for performing a sister sub-block test 1124 and/or the code for performing a sister sub-block test 1144 may be configured to identify a sister sub-block wordline in the second sub-block having a worst wordline quality amongst all sub-block wordlines of the second sub-block. The circuit/module for performing a sister sub-block test 1124 and/or the code for performing a sister sub-block test 1144 may then be further configured to perform a subsequent wordline quality determination of whether a sister sub-block wordline quality of a wordline in the second sub-block is below a scrub trigger threshold, wherein a determination of whether to add the second sub-block to the read scrub queue is based on the subsequent wordline quality determination. It should also be appreciated that, because the sister sub-block wordline having the worst wordline quality in the second sub-block may be unwritten, the circuit/module for performing a sister sub-block test 1124 and/or the code for performing a sister sub-block test 1144 may be configured to perform the subsequent wordline quality determination on a sister sub-block wordline neighboring the unwritten sister sub-block wordline with the worst wordline quality.

First Example Process

Figure 12:
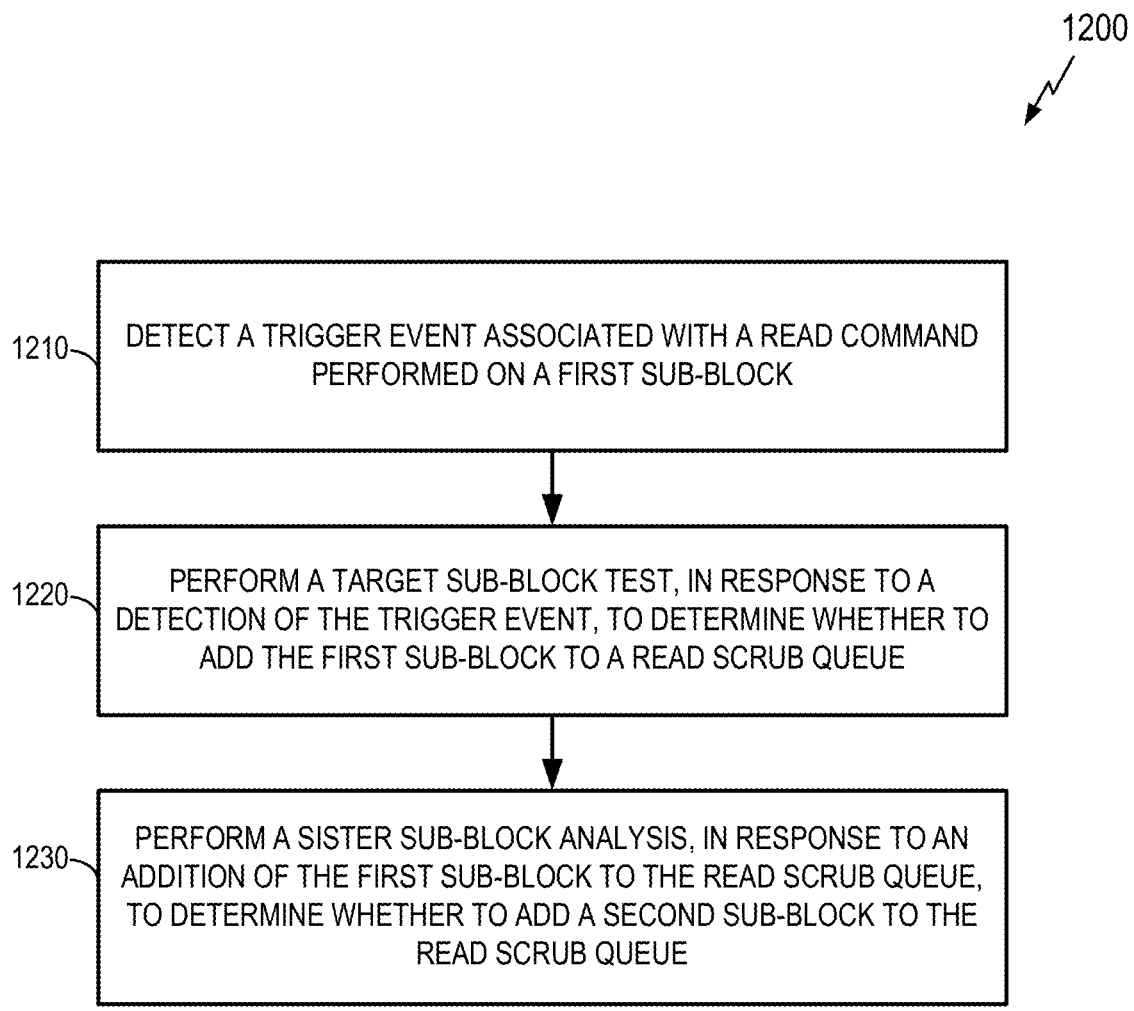
FIG. 12 illustrates an example process for performing a sub-block read scrub in accordance with one or more aspects of the disclosure.

FIG. 12 illustrates a process 1200 for communication in accordance with some aspects of the disclosure. The process 1200 may take place within a processing circuit (e.g., the processing circuit 1110 of FIG. 11), which may be located in a controller, an SSD, an SSD drive, a host device, an NVM device, a NAND die, or some other suitable apparatus. In a particular aspect of the disclosure, it is contemplated that the process 1200 is a data storage method operable on a non-volatile memory device (e.g., memory device 1108) in which the non-volatile memory device includes a block comprising N wordlines partitioned into a first sub-block (e.g., a target sub-block) comprising a first subset of the N wordlines and a second sub-block (e.g., a sister sub-block) comprising a second subset of the N wordlines different than the first subset. Of course, in various aspects within the scope of the disclosure, the process 1200 may be implemented by any suitable apparatus capable of supporting memory-related operations. As described below, some or all illustrated features may be omitted in a particular implementation within the scope of the present disclosure, and some illustrated features may not be required for implementation of all embodiments.

The process 1200 begins at block 1210 with the apparatus (e.g., apparatus 1100) detecting a trigger event associated with a read command performed on the first sub-block. At block 1220, the process 1200 proceeds with the apparatus (e.g., apparatus 1100) performing a target sub-block test, in response to a detection of the trigger event, to determine whether to add the first sub-block to a read scrub queue. The process 1200 then concludes at block 1230 where the apparatus (e.g., apparatus 1100) performs a sister sub-block test, in response to an addition of the first sub-block to the read scrub queue, to determine whether to add the second sub-block to the read scrub queue.

In some aspects, a process in accordance with the teachings herein may include any combination of the above operations.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
  a non-volatile memory, wherein the non-volatile memory device includes a block comprising N wordlines partitioned into a first sub-block and a second sub-block, and wherein the first sub-block comprises a first subset of the N wordlines and the second sub-block comprises a second subset of the N wordlines different than the first subset; and
  a processor coupled to the non-volatile memory and configured to:
    detect a trigger event associated with a read command performed on the first sub-block;
    perform, in response to a detection of the trigger event, a target sub-block test to determine whether to add the first sub-block to a read scrub queue; and
    perform, in response to the first sub-block being added to the read scrub queue, a sister sub-block test to determine whether to add the second sub-block to the read scrub queue.

2. The data storage apparatus of claim 1, wherein the trigger event comprises a read error associated with the read command.

3. The data storage apparatus of claim 2, wherein the processor is further configured to:
  perform a determination of whether the read command is associated with at least one scrub trigger case listed in a dynamic read table; and
  determine whether to add at least one of the first sub-block or the second sub-block to the read scrub queue based on the determination.

4. The data storage apparatus of claim 3, wherein the dynamic read table comprises a corresponding scrub trigger threshold for the at least one scrub trigger case, and wherein the processor is further configured to add the at least one of the first sub-block or the second sub-block to the read scrub queue based on whether the corresponding scrub trigger threshold for the at least one scrub trigger case is exceeded.

5. The data storage apparatus of claim 1, wherein the first sub-block and the second sub-block are separated by at least one dummy wordline, and wherein the at least one dummy wordline is configured to remain unprogrammed.

6. The data storage apparatus of claim 1, wherein the trigger event is a threshold number of read commands exceeded.

7. The data storage apparatus of claim 6, wherein the processor is further configured to identify the first sub-block as a target sub-block based on whether the read command corresponds to a wordline in the first sub-block or the second sub-block.

8. The data storage apparatus of claim 7, wherein the processor is further configured to:
 determine a wordline quality of the wordline and at least one neighboring wordline of the wordline;
 compare the wordline quality of either the wordline or the at least one neighboring wordline to a scrub trigger threshold; and
 perform the sister sub-block test in response to a determination that the wordline quality of either the wordline or the at least one neighboring wordline is below the scrub trigger threshold.

9. The data storage apparatus of claim 8, wherein the processor is further configured to:
 identify a sister sub-block wordline in the second sub-block having a worst wordline quality amongst all sub-block wordlines of the second sub-block; and
 add the second sub-block to the read scrub queue based on whether the worst wordline quality is below the scrub trigger threshold.

10. A data storage method operable on a non-volatile memory, wherein the non-volatile memory includes a block comprising N wordlines partitioned into a first sub-block and a second sub-block, and wherein the first sub-block comprises a first subset of the N wordlines and the second sub-block comprises a second subset of the N wordlines different than the first subset, the data storage method comprising:
 detecting a trigger event associated with a read command performed on the first sub-block;
 performing, in response to a detection of the trigger event, a target sub-block test to determine whether to add the first sub-block to a read scrub queue; and
 performing, in response to the first sub-block being added to the read scrub queue, a sister sub-block test to determine whether to add the second sub-block to the read scrub queue.

11. The data storage method of claim 10, further comprising:
 accessing a dynamic read table, wherein the dynamic read table includes aspects associated with at least one scrub trigger case; and
 determining whether to add at least one of the first sub-block or the second sub-block to the read scrub queue based on a comparison of aspects associated with the read command and the aspects associated with the at least one scrub trigger case.

12. The data storage method of claim 11, wherein the accessing comprises ascertaining a corresponding scrub trigger threshold of the at least one scrub trigger case, and wherein the determining of whether to add the at least one of the first sub-block or the second sub-block to the read scrub queue is based on whether the corresponding scrub trigger threshold for the at least one scrub trigger case is exceeded.

13. The data storage method of claim 12, wherein the performing of the target sub-block test comprises:
 identifying a target sub-block wordline in the first sub-block corresponding to the read command; and
 performing a target sub-block comparison of aspects associated with the target sub-block wordline and the corresponding scrub trigger threshold for the at least one scrub trigger case, wherein a determination of whether to add the first sub-block to the read scrub queue is based on the target sub-block comparison.

14. The data storage method of claim 12, wherein the performing of the sister sub-block test comprises:
 identifying a sister sub-block wordline in the second sub-block having a worst wordline quality amongst all sub-block wordlines of the second sub-block; and
 performing a sister sub-block comparison of aspects associated with the sister sub-block wordline and the corresponding scrub trigger threshold for the at least one scrub trigger case, wherein a determination of whether to add the second sub-block to the read scrub queue is based on the sister sub-block comparison.

15. The data storage method of claim 10, further comprising:
 determining a wordline quality of a target sub-block wordline in the first sub-block corresponding to the read command and at least one neighboring wordline of the target sub-block wordline;
 comparing the wordline quality of either the target sub-block wordline or the at least one neighboring wordline to a scrub trigger threshold; and
 performing the sister sub-block test in response to a determination that the wordline quality of either the wordline or the at least one neighboring wordline is below the scrub trigger threshold.

16. The data storage method of claim 15, further comprising:
 performing a subsequent wordline quality determination of whether a sister sub-block wordline quality of a wordline in the second sub-block is below the scrub trigger threshold; and
 determining whether to add the second sub-block to the read scrub queue based on the subsequent wordline quality determination.

17. The data storage method of claim 16, wherein the performing of the subsequent wordline quality determination is performed on a sister sub-block wordline in the second sub-block neighboring an unwritten sister sub-block wordline in the second sub-block having a worst wordline quality amongst all sub-block wordlines of the second sub-block.

18. A data storage apparatus, comprising:
 a non-volatile memory, wherein the non-volatile memory includes a block comprising N wordlines partitioned into a first sub-block and a second sub-block, and wherein the first sub-block comprises a first subset of the N wordlines and the second sub-block comprises a second subset of the N wordlines different than the first subset;
 means for detecting a trigger event associated with a read command performed on the first sub-block;

means for performing, in response to a detection of the trigger event, a target sub-block test to determine whether to add the first sub-block to a read scrub queue; and means for performing, in response to the first sub-block being added to the read scrub queue, a sister sub-block test to determine whether to add the second sub-block to the read scrub queue.

19. The data storage apparatus of claim 18, wherein the target sub-block test is based on whether the read command is associated with at least one scrub trigger case listed in a dynamic read table.

20. The data storage apparatus of claim 18, wherein the target sub-block test is based on a periodic scan of the target sub-block triggered when a total number of read commands exceed a threshold number of read commands.

* * * * *